United States Patent [19]

Kawaguchi

[11] Patent Number: 4,899,924
[45] Date of Patent: Feb. 13, 1990

[54] AUTOMATIC SOLDERING METHOD AND DEVICE

[75] Inventor: Seiji Kawaguchi, Tokyo, Japan
[73] Assignee: Apollo Seiko Ltd., Japan
[21] Appl. No.: 223,445
[22] Filed: Jul. 22, 1988
[30] Foreign Application Priority Data
  May 30, 1986 [JP] Japan ............................ 61-123507
[51] Int. Cl.$^4$ ........................... B23K 3/04; B23K 3/06
[52] U.S. Cl. ............................................... 228/242
[58] Field of Search ....................... 228/223, 242, 243
[56] References Cited

U.S. PATENT DOCUMENTS

| | | | |
|---|---|---|---|
| 3,409,977 | 11/1968 | Johnson | 228/242 |
| 3,717,742 | 2/1973 | Fottler | 228/223 |
| 3,718,968 | 3/1973 | Sims et al. | 228/242 |
| 3,734,791 | 5/1973 | Poliak | 228/223 |
| 3,974,016 | 8/1976 | Bondybey et al. | 228/242 |
| 4,185,185 | 1/1980 | Adlam | 228/242 |
| 4,187,408 | 2/1980 | Heile | 228/242 |
| 4,534,811 | 8/1985 | Ainslie et al. | 228/242 |

FOREIGN PATENT DOCUMENTS 6153737 3/1986 Japan ................................. 228/242

Primary Examiner—M. Jordan
Attorney, Agent, or Firm—Klauber & Jackson

[57] ABSTRACT

The automatic soldering method and related device of this invention can perform both spot soldering and continuous soldering at any soldering position through the application of heat to both the soldering spot and the string solder, using as a heating means, a light beam such as a laser beam. This thus avoids the use of a soldering iron as a heating means and further, the soldering spot is not damaged since heat can be applied to the spot and string solder by a "non-contact" means.

11 Claims, 8 Drawing Sheets

AUTOMATIC SOLDERING METHOD AND DEVICE

BACKGROUND OF THE INVENTION

This invention concerns an automatic soldering method which uses a light beam such as a laser beam, and a related device for automatic soldering.

Almost all previous automatic soldering art used a soldering iron, and soldering was executed at a desired soldering spot by supplying string solder to the soldering iron which was mounted on the tip of a robot arm.

However, use of the said soldering iron meant that whenever a different spot (or a different object) was to be soldered, it was necessary to select a soldering iron of the appropriate size and shape, resulting in reduced general applicability and work efficiency. Further, because the tip of the soldering iron had to be pressed against the soldering spot, there was the danger of causing damage to the soldering spot, especially with linear soldering work along a continuous position.

BRIEF SUMMARY OF THE INVENTION

As a result of extensive research into alternative heat sources for melting solder to be used instead of a soldering iron, this invention which makes use of a light beam such as a laser beam was developed. To the applicant's knowledge there have been no previous applications of this type of light beam to soldering technology; thus this invention represents both the development of a new soldering technology and the development of new uses for light beams.

The various features and advantages of this invention will be enumerated in the following detailed description which makes reference to the attached drawings.

DESCRIPTION OF THE PREFERRED EMBODIMENTS

The following gives an explanation of one example of an optimum embodiment of this invention based on the automatic soldering device shown in FIGS. 1 through 7.

Figure 4:
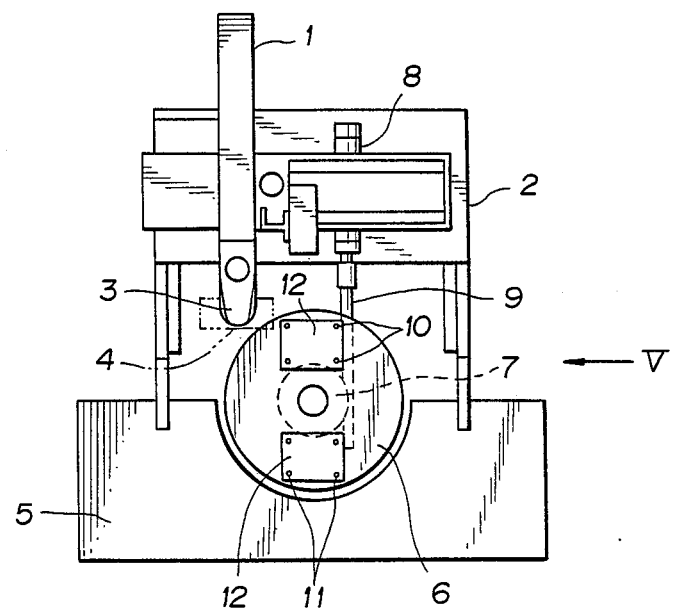
FIG. 4 is a plan drawing showing the whole automatic soldering device assembly.
Figure 5:
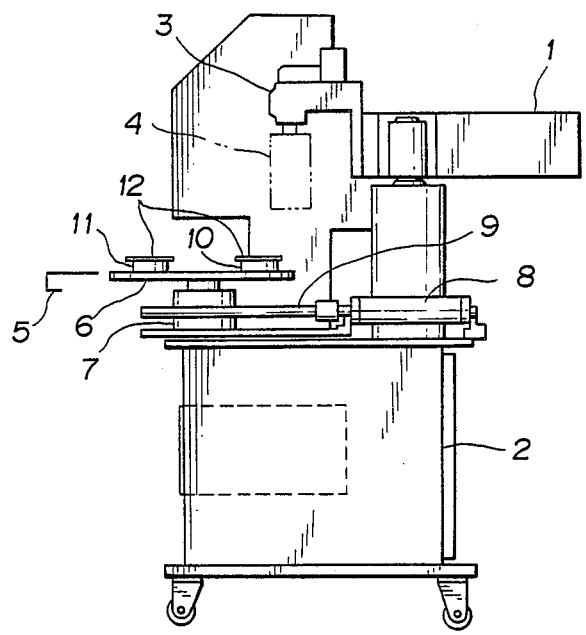
FIG. 5 is a side view from the arrowed V mark in FIG. 4.

Further, before giving a detailed explanation of this system, the overall construction of this device will be described with reference to FIGS. 4 and 5.

Reference numeral 1 shows a robot arm, in its position fixed on the mounting stand 2 having casters. The head 3 at the top end of this robot arm 1 can move or rotate back and forth, to the right or the left, and up and down as required. A soldering unit 4 described later is mounted on this head 3. Additionally, a working table 5 and a rotating table 6 are positioned on the mounting stand 2. This rotating table 6 can rotate 180 degrees freely through the combination of pinion 7 which is attached to the rotation shaft of the rotating table with a rack 9 which moves back and forth freely through operation of an air cylinder 8. Two sets of four pins 10 and 11 are mounted upright in two opposing places on this rotating table 6, for respective positioning and mounting of the printed circuit board 12 to be soldered on the sets of pins 10 and 11. This is so that while one printed circuit board 12 is being soldered, the other can be loaded ready, and once the soldering of the first printed circuit board 12 is complete, the rotating table 6 rotates 180 degrees, and the next printed circuit board 12 is brought to the work position.

Figure 1:
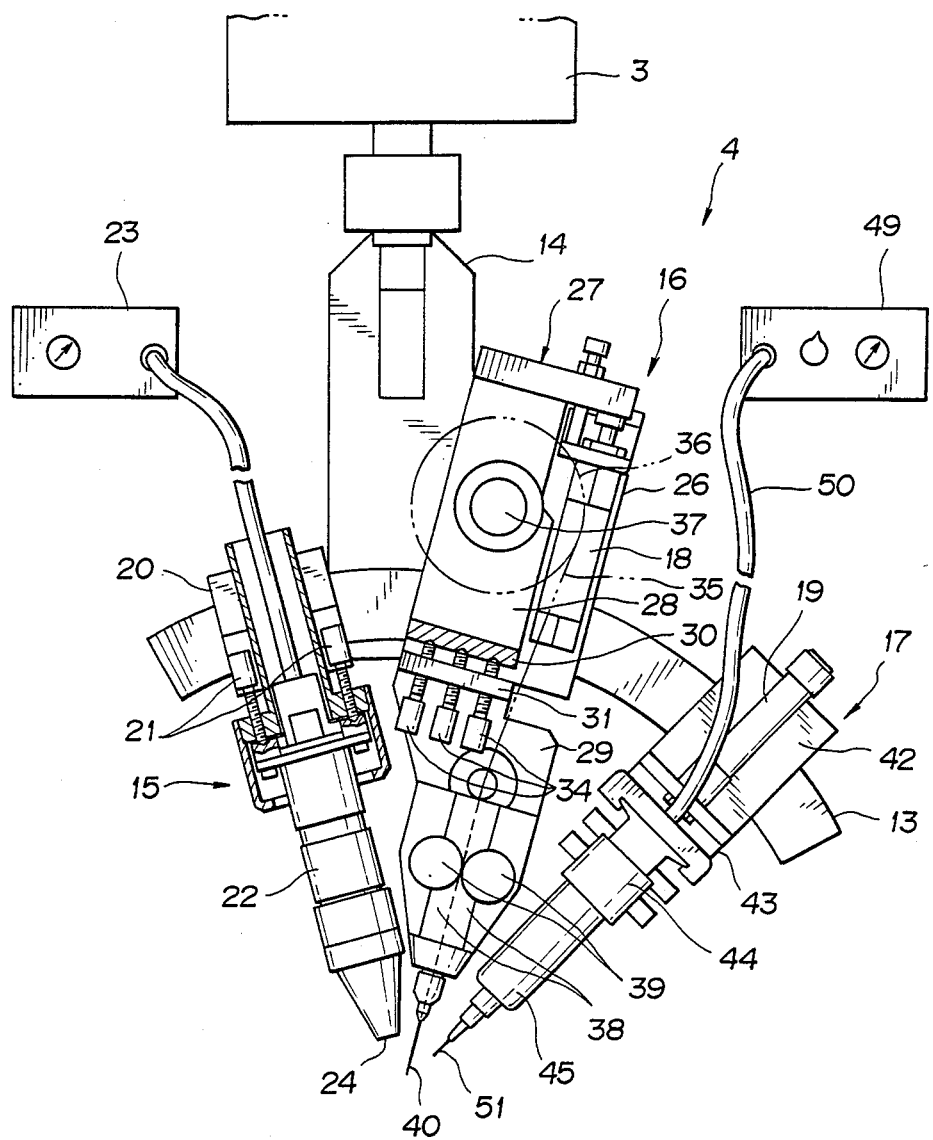
FIG. 1 is a partial sectional side view of the soldering unit of the automatic soldering device in one embodiment of this invention.
Figure 2:
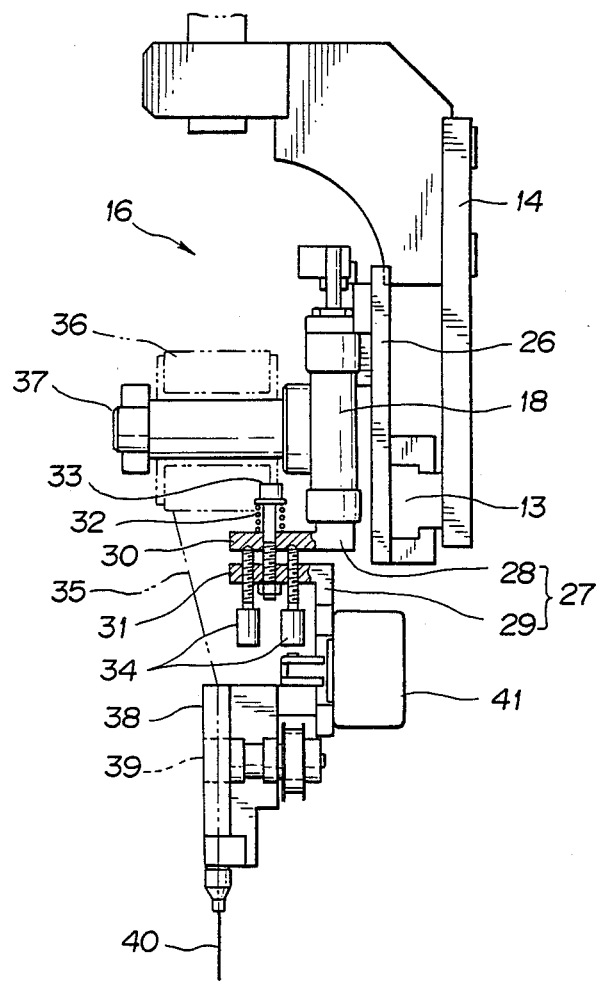
FIG. 2 is a partial sectional side view of the string soldering supplying device.
Figure 3:
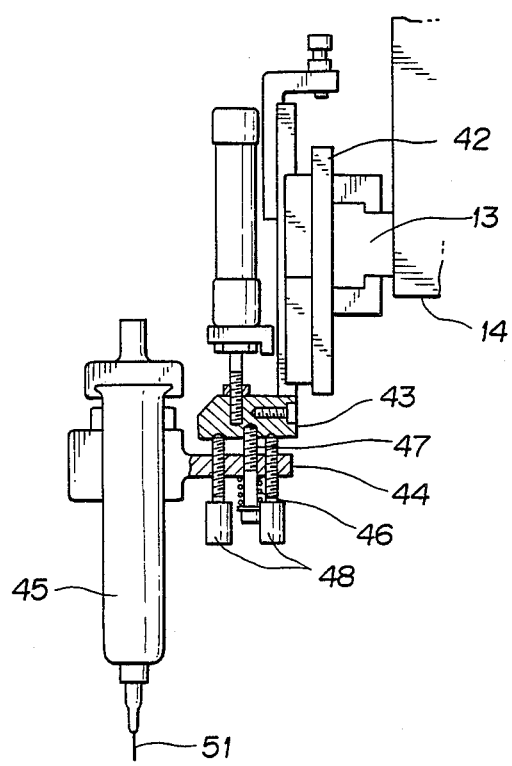
FIG. 3 is a partial sectional side view of the flux supplying device.

Next, the main part of this device will be described with reference to FIGS. 1 through 3. A supporting plate 14 having a curved arm 13 under it, is fixed to the head 3 of the robot arm 1 in a hanging state. At the center of this curved arm 13 a laser irradiation device 15 and a fine string solder supplying device 16 are attached in a position in the form of a V, diagonally opposed to each other as "light beam irradiation equipment". Moreover, one end of this curved arm 13 is extended lengthwise, and at the extended part a flux supplying device 17 is diagonally attached in the same manner as the laser irradiation device 15 and the fine string soldering device 16. All the central lines of this laser irradiation device 15, fine string solder supplying device 16 and flux supplying device 17 are set so that those lines meet at the same point (that is to say, at the spot to be soldered). In particular, the fine string solder supplying device 16 and the flux supplying device 17 can move up and down freely toward soldering spot P by means of their respective air cylinders 18 and 19 described later. Also, the action of each device 15, 16 and 17 of the said robot arm 1 and the soldering unit 4 are controlled by a computer not shown in the drawing into which has been previously recorded the operating state.

The laser irradiation device 15 comprises a cylindrical fixed body 20 fixed to the curved arm 13 and a movable body 22 attached to this fixed body 20 fixed with three adjusting screws 21 placed at intervals of 120 degree angles. The fixed body 20 is connected to a separate laser generator 23 and the YAG laser ray L can be irradiated at the "Light Beam" from the irradiating port 24 at the top of movable body 22 onto the soldering part P. Also, this YAG laser ray L is passed through the lens unit 25 in the laser irradiation device 15 and focussed for irradiation on soldering spot P. The position irradiated by this TAG laser ray L can be precisely adjusted by adjusting the angle at which the movable body 22 is attached against fixed body 20 using the three sets of adjusting screws 21. Since YAG laser ray L is not visible a helium neon display is employed for visual confirmation.

The fine string solder supplying device 16 comprises a fixed part 26 fixed to the aforementioned curved arm 13 and the up-and-down movable part 27 supported at the fixed part 26 by a sliding bearing and operated by air cylinder 18. The movable part 27 moreover, comprises an upper body 28 and a lower body part 29 connected to the body 278 that can move up and down. On the upper body 28 and the lower part 29, the flanges 30 and 31 are positioned in an upright position opposing each other, and these flanges 30 and 31 are attached by three screws arranged at intervals of 120 degrees so that both flanges are fixed approaching each other by means of attaching screw 33 having spring 32. As in the case of the aforementioned laser irradiation device 15, the attached angle of the lower part body 29 to the upper body 28 can be adjusted precisely by adjusting the degree of tightness of the these three adjusting screws 34.

Also, in the center of upper body 28 the shaft 37 projects for attachment of the reel 36 around which the string solder 35 is wound, permitting the reel 36 to rotate freely. One end of the string solder 35 is introduced from this reel 36 into the feeding guide 38 placed at the center of the lower body 29. This feeding guide 38 consists of a combination of a pair of left and right feeding guides having sliding channels respectively. At the center of this feeding guide 38, a pair of left and right pinch rollers 39 hold the string solder in between them and are arranged so that any amount of the string solder required can be fed by rotating these pinch rollers 39. Also attached is the top end nozzle 40 having the same inside diameter as the outside diameter of the string solder 35. This top end nozzle 40 is made of stainless steel and the inside surface in contact with the string solder 35 is lined with teflon. The top end of the string solder 35 is fed through the guide by the pinch roller 39 and extruded from the end of the nozzle 40 to perform soldering. Additionally, the motor 41 for turning the abovementioned pinch roller 39 is mounted on the rear side of the lower part body 29.

The flux supplying device 17, like the aforementioned fine string solder supplying device 16, comprises a fixing part 42 fixed to the curved arm 13, a movable part 43 which can move up and down through the action of an air cylinder 19 fixed to the fixing part 42, an attaching part 44 mounted so as to enable the angle of attachment to be precisely adjusted in relation to this movable part 44, and a flux dispenser 45 fixed to this fixing part 44. The movable part 43 and the attaching part 44 are attached in the same manner as previously described in the previous section, with the three adjusting screws 48 placed at every 120 degree intervals apart so that both 43 and 44 are inclined towards each other through an attaching screw 47 having a spring 46. The flux dispenser 45 is connected to a separate flux storage equipment 49 and tube 50, and the necessary amount of liquid flux is fed to the flux supplying device 17 as required, the atomizing nozzle 51 at the top end of the flux supplying device 17 sprays the flux F onto the soldering spot P of the work piece.

A description of the action of this device now follows. Since this device can be used to solder either one point of the work piece—so-called spot soldering—or can solder the work piece linearly—so-called continuous soldering, both methods will be described.

a. SPOT SOLDERING

Spot soldering work will be described first with reference to FIGS. 6(A) through 6(D). An example of spot soldering, for example, might be the soldering of IC pin 52 at the rear side of the printed circuit board 12.

a-1. Action of positioning

Figure 6A:
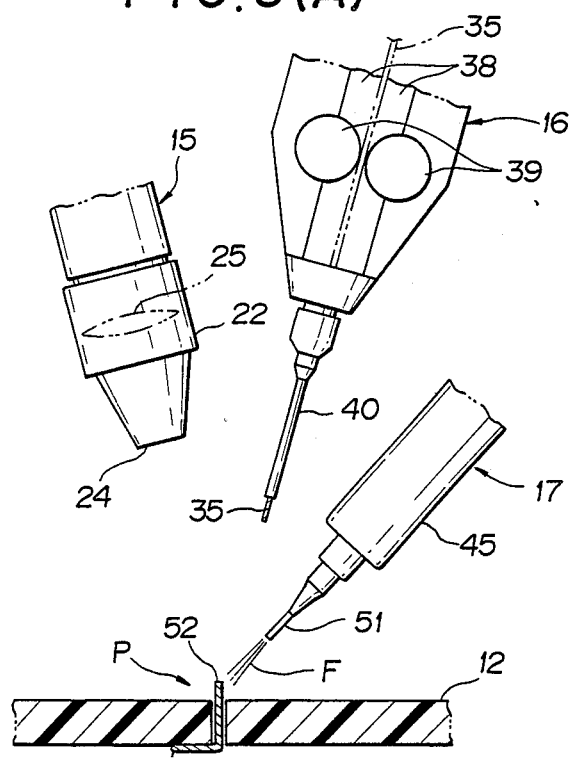
FIG. 6(A) is an enlarged view of the spot being soldered showing flux supply during "spot soldering".
Figure 6B:
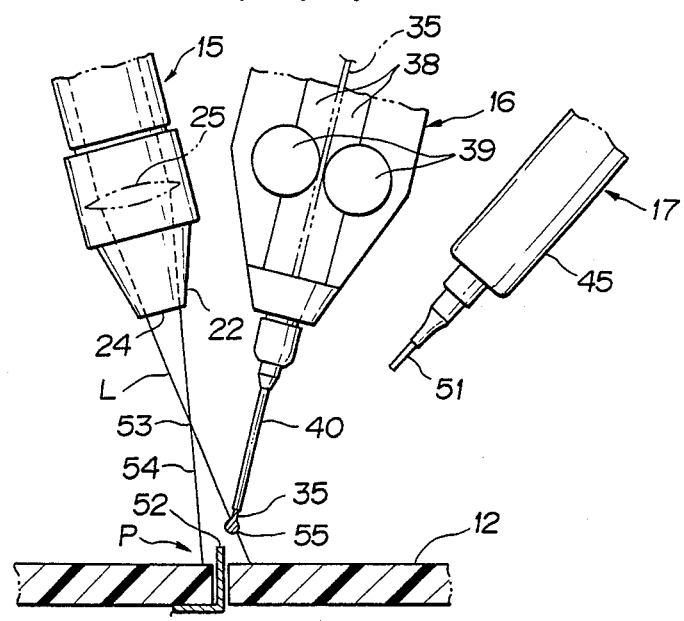
FIG. 6(B) is an enlarged view showing laser irradiation (same enlargement as FIG. 6(A)).
Figure 6C:
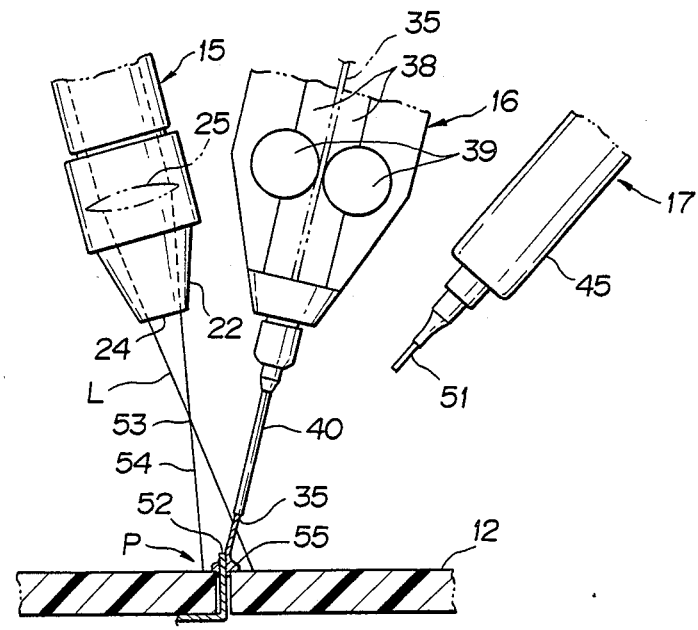
FIG. 6(C) is an enlarged view of the primary supply of string solder (same enlargement as Fig. 6(A)).
Figure 6D:
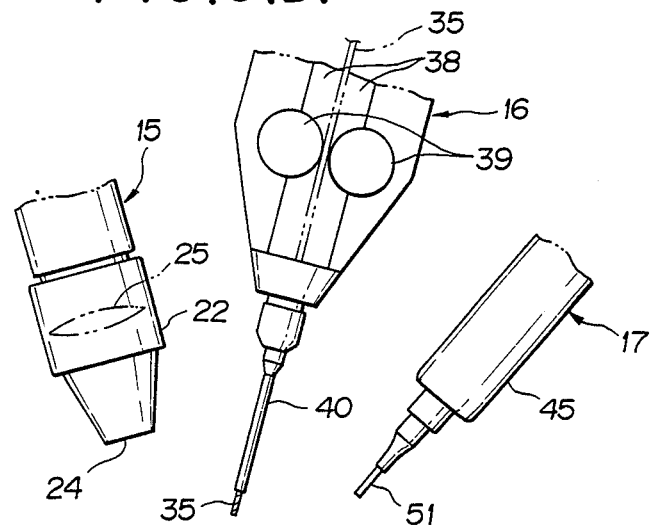
FIG. 6(D) is an enlarged view of the secondary supply of string solder (same enlargement as Fig. 6(A)).
Figure 6D:
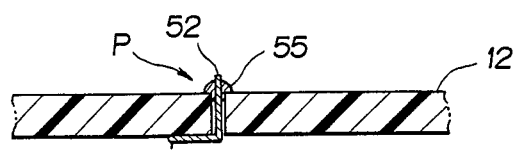

First of all, the soldering unit 4 should be moved and positioned with the robot arm 1 so that the center lines of devices 15 and 16 in the soldering unit 4 are exactly aligned with the soldering spot P (that is, the position of pin 52) on the printed circuit board 12.

a-2 Action of feeding flux (refer to FIG. 6(A))

After the soldering unit 4 has been successfully positioned, the flux dispenser 45 of the flux feeding device 17 moves down to the soldering spot P by means of the air cylinder 19, the dispenser coats the required amount of flux on the spot P and then the dispenser is moved up again.

a-3 Action of laser irradiation (Refer to FIG. 6 (B))

After the flux F is applied to the soldering spot P, the YAG laser ray L is irradiated from the laser irradiation device 15 and focussed on the soldering spot P. In this case, since the focus 53 of the YAG laser ray L to be irradiated is set a little above the soldering spot P, the laser ray L can be irradiated to the soldering point P again while being diffused again, so that a slanting conical diffusing part 54 is formed under the focus 53 by the laser ray L, then only the area of the soldering spot P corresponding to the slanted bottom surface of the diffusing part 54, as the irradiation passageway, is irradiated. Through the formation of such conical diffusing part 54 by the laser ray L, the top end of the string solder 35 is exposed in almost a right angle in relation to the YAG laser ray L, permitting the accurate formation of dropstate solder 55. At this soldering spot P, by irradiation of the YAG laser ray the flux F previously sprayed becomes volatile, and at the same time the soldering part P is heated and becomes completely active so that the string solder 35 can be easily soldered. The area for irradiation by the YAG laser ray L can be adjusted either wider or narrower by adjusting the lens unit 25 of the laser irradiation device 15 so that the irradiation area can be adjusted in response to the soldering part P accordingly. This means that, in contrast to devices currently in use, it is not necessary to change soldering irons for soldering different areas of soldering spot P. Moreover, since laser ray L is used, there is no feat of interference with pin 52 during soldering work.

a-4. Action of primary supply of the string solder (Refer go Fig, 6(C))

Next, lower part body 29 of the fine string solder supplying device 16 is moved down, and the top end nozzle 40 is moved near to the soldering spot P. A specified length of the top end of the string solder 35 is extruded from the top end nozzle 40 by rotating pinch rollers 39 and is exposed to the diffusing part 54 of the abovementioned YAG laser ray L. Then this top end of string solder 35 is melted by the laser ray L and the melted drop-state solder 55 stays at the top end of the string solder 35. The supply of string solder 35 for making this melted drop-state solder 55 is called the primary supply of the string solder 35.

a-5: Action of secondary supply of the string solder (Refer to FIG. 6(D))

Once the top end of the string solder 35 becomes drop-state solder 55, more string solder 35 is fed by the rotation of pinch rollers 39, then melted solder flows onto the soldering spot P through the action of pushing the drop-state solder 55 onto the soldering spot P. Subsequently string solder 35 continues to be supplied in the required amounts. The supply of drop-state solder 55 in this way is called the secondary supply of string solder 35. Irradiation by YAG laser rays stops after drop-state solder 55 is pushed onto the soldering spot P, ending secondary solder supply, and the lower body 29 of the fine string solder supplying device 16 is moved up by the air cylinder 18. At this point the drop-state solder 55 is soldered on the soldering spot P and spot soldering work is complete. The soldering unit 4 is then moved to the next soldering spot P by the robot arm 1.

Continuous soldering

Figure 7:
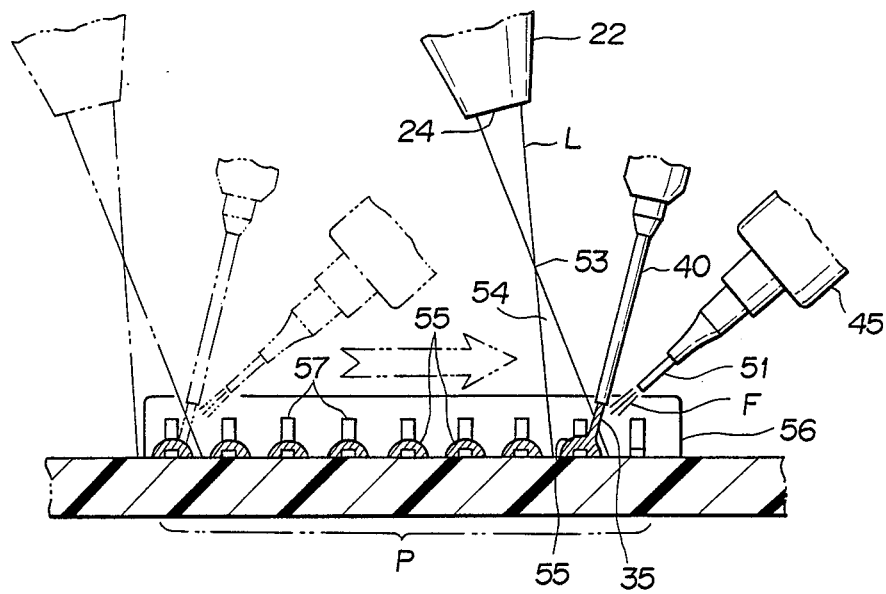
FIG. 7 is an enlarged view of the area being soldered showing the secondary supply of string solder during continuous soldering.

Next, continuous soldering of continuously arranged linear soldering spots will be described with reference to FIG. 7. An example of continuous soldering work is the soldering of plural pins 57 continuously arranged on one side of an IC56 flat pack.

b-1: Positioning

This is the same as described above for spot soldering. However, in this case, the soldering unit 4 is positioned at the front end of the continuous soldering spot P.

b-2: Action of flux supply

This is identical to the aforementioned spot soldering, with the exception that a constant amount of flux F is continuously sprayed from the flux dispenser 45 onto the soldering spot P.

b-3: Irradiation of laser

This is identical to the spot soldering case described above.

b-4: Primary supply of string solder

This is the same as for spot soldering. However, irradiation of YAG laser rays by the laser irradiation device 15 does not end but continues even if drop-state solder 55 is formed at the top end of the string solder 35.

b-5: Action of secondary supply of the string solder (Refer to FIG. 7).

When the top end of the string solder 35 becomes drop-state solder 55, more string solder 35 is fed by the rotation of the pinch rollers 39, and the drop-state solder 55 is pushed to the front (start) end of the soldering spot P. Even after the dropstate solder 55 has been pushed to the start of the soldering spot P, the string solder 35 continues to be fed by the action of the pinch rollers 39, and at the same time the whole soldering unit 4 is moved by the robot arm 1 to a position over the soldering spot P where the end of the string solder 35 is being continuously soldered. Needless to say the irradiation of the YAG laser ray and the spraying of the flux F is going on simultaneously at the top end of the string solder respectively. Thus, the soldering spot P is continuously soldered with the proper amount of drop-state solder 55, providing continuous linear soldering of the soldering spot P. And if the top end of the string solder 35 moves to the end of the soldering spot P, the feeding of the string solder 35, the irradiation of YAG laser rays L and the supply of flux F are completely terminated, and the whole soldering unit 4 is lifted up and moved to the start of the next soldering spot P. In this manner if a plural amount of pins 57 mounted on one side of the flat pack IC 56 are soldered linearly and continuously, the melted solder 35 is cut at every pin 57 due to surface tension, and the cut solder stays at the pin 57 in the state of a drop, thus achieving the effect of continuous spot soldering. However, in contrast to previous soldering iron usage, use of the YAG laser achieves so-called "non-contact soldering", and the soldering spot P is not damaged in any way even if soldering is performed linearly along a continuous soldering spot P, making this the most suitable soldering method for very fine soldering work. Furthermore, the ability to perform continuous soldering means that bent or curved soldering spots as well as linear soldering spots can now be soldered easily.

The preceding explanation has used the example of a YAG laser ray L as a light beam. However, other light beams from other sources such as Xenon lamp may also be used, as long as they can melt the string solder. Also, although the example of spraying liquid-state flux F in soldering work is described above, any material suitable for use as string solder 35, including gold, silver, or tin, as long as it contains flux, can be used, and spraying of flux while soldering is not necessary.

The automatic soldering method and related devices of these inventions (Inventions 1 and 2) have been introduced in the preceding description: in this method, since the soldering spot is irradiated by a light beam, the flux material used for the soldering spot is activated and the soldering spot itself is heated, giving a good soldering effect. Also, since the top end of the string solder exposed in the path of the light beam is melted, by touching the melted string solder to the soldering spot, either spot soldering of one soldering spot or continuous soldering of linearly arranged soldering spots can be carried out freely and continuously.

Moreover, since the heat source used to melt the string solder is a light beam, this beam can be easily adjusted by adjusting the lens unit etc, in accordance with the size and shape of the soldering spot. This permits proper and accurate soldering appropriate to the soldering spot, and the need to change the soldering iron no longer arises.

Further, the use of a light beam permits so-called "non-contact soldering" to be achieved, with the advantage that the soldering spot is not damaged, making this method suitable for very fine soldering work.

What is claimed is:

1. A method of automatic soldering of a first component to a second component in an area, comprising the steps of:
    heating the area directly by irradiation of said area with a light beam;
    activating flux on said area by direct irradiation of said flux with said light beam;
    directly melting a tip of string solder with said light beam by placing the tip of said string solder in the path of radiation from said light beam; and
    applying said melted string solder to said area so as to solder said area with said melted string solder.

2. An automatic soldering method according to claim 1, wherein said area is a spot.

3. An automatic soldering method according to claim 1, wherein said area extends in a substantially linear direction, said steps of heating, activating and melting include the step of moving said light beam over said area in said linear direction, and said step of applying includes the step of applying said melted string solder substantially continuously to said area in said linear direction.

4. An automatic soldering method according to claim 1, further including the step of irradiating a laser beam as said light beam on said area.

5. An automatic soldering method according to claim 1, further including the step of applying said flux on said area.

6. An automatic soldering device for soldering a first component to a second component in an area, said device comprising:
    (a) light beam irradiation means for:
        (i) heating the area directly by irradiation of said area with a light beam, (ii) activating flux on said area by direct irradiation of said flux with said light beam, and (iii) directly melting a tip of string solder with said light beam by placing said tip in the path of radiation from said light beam; and (b) string solder supplying means for freely supplying string solder to said path of radiation from said light beam so that said string solder is melted by said light beam and deposited on said area.

7. An automatic soldering device according to claim 6, wherein said light beam irradiation means includes a laser beam irradiation device.

8. An automatic soldering device according to claim 7, wherein said laser beam irradiation device includes a YAG laser.

9. An automatic soldering device according to claim 6, further including flux supplying means for supplying said flux on said area.

10. An automatic soldering device according to claim 9, further including common support means for commonly supporting said light beam irradiation means, said string solder supplying means and said flux supplying means.

11. An automatic soldering device according to claim 10, further including means for moving said common support means.

* * * * *